(12) United States Patent
Williams et al.

(10) Patent No.: US 6,400,626 B1
(45) Date of Patent: Jun. 4, 2002

(54) MEMORY DEVICES

(75) Inventors: Dave Williams, Gloucestershire; Mike Hammick, Dorset, both of (GB)

(73) Assignee: Clearspeed Technology Limited, Bristol (GB)

( * ) Notice: Subject to any disclaimer, the term of this patent is extended or adjusted under 35 U.S.C. 154(b) by 0 days.

(21) Appl. No.: 09/666,166

(22) Filed: Sep. 19, 2000

(30) Foreign Application Priority Data

Sep. 24, 1999 (GB) .............................................. 9922716

(51) Int. Cl.⁷ ................................................. G11C 7/00
(52) U.S. Cl. .................... 365/205; 365/63; 365/189.01; 365/196
(58) Field of Search ..................... 365/205, 63, 189.01, 365/196, 230.01

(56) References Cited

U.S. PATENT DOCUMENTS

| | | | |
|---|---|---|---|
| 5,303,196 A | * | 4/1994 | Sang et al. ................. 365/206 |
| 5,434,821 A | | 7/1995 | Watanabe et al. |
| 5,483,495 A | * | 1/1996 | Fukuda et al. ............... 365/210 |
| 5,539,701 A | | 7/1996 | Shimizu |
| 5,546,343 A | | 8/1996 | Elliott et al. |
| 5,923,605 A | * | 7/1999 | Mueller et al. ......... 365/230.13 |
| 5,956,274 A | | 9/1999 | Elliott et al. |
| 5,959,922 A | * | 9/1999 | Jung ........................... 365/210 |
| 5,966,315 A | * | 10/1999 | Muller et al. .................. 365/51 |
| 6,136,638 A | * | 10/2000 | Lee et al. .................... 438/238 |
| 6,154,406 A | * | 11/2000 | Miyano et al. ............. 365/220 |

FOREIGN PATENT DOCUMENTS

| GB | 2227109 | 7/1990 |
|---|---|---|
| GB | 2299694 | 10/1996 |

* cited by examiner

*Primary Examiner*—Viet Q. Nguyen
(74) *Attorney, Agent, or Firm*—Burns, Doane, Swecker & Mathis, L.L.P.

(57) ABSTRACT

A dynamic random access memory device comprises an array of memory cells each of which has an output line associated therewith. The memory cells are arranged in an array having a width equalling the number of data bits transferred in parallel to and from the device.

7 Claims, 4 Drawing Sheets

MEMORY DEVICES

FIELD OF THE INVENTION

The invention relates to memory devices.

BACKGROUND TO THE INVENTION

A key component of computers, both large scale and personal computers (PCs), and many other electronic products, is the Dynamic Random Access Memory (DRAM). DRAM integrated circuits are used to store binary data, and are well known and understood. A typical DRAM stores 64 Mbit of data (where 1 Mbit is $2^{20}$ or 1,048,576 bits). Each bit requires a memory cell.

Each memory cell consists of a capacitor and a switch. The capacitor stores charge, and the switch (which is typically a MOSFET) allows transfer of the charge to a common line (or bitline) for access. The presence of a charge, for example, can be used to indicate a logic "1", and the lack of such a charge used to indicate a logic "0". The signal controlling the switch is commonly called a wordline, and the data appears on the bitline.

The memory cells are arranged in an array of rows (or wordlines) and columns (or bitlines), which are normally orthogonal to each other.

Traditional DRAM have been arranged in multiple arrays for speed of data access, since reduction of the wordline length reduces the electrical delay for cell selection, and reduction of the bitline length increases the signal developed for sensing, thus making sensing faster.

The size of the signal development available for sensing is dependent on the relative capacitance of the memory cell's capacitor as compared with the bitline's parasitic capacitance. The higher the ratio of memory cell capacitance to bitline capacitance, the larger the signal.

However, in order to have a high density of memory cells, the memory cell size and hence its capacitance is limited, which means that the bitline capacitance must be reduced for safe sensing. This results in a limit on the length of the bitline and hence the number of memory cells per bitline. For this reason, memory devices are arranged into multiple arrays as mentioned above.

However, the use of multiple arrays requires multiplexing of the data from these arrays. Thus, there is a requirement for the data to pass at least one multiplexing element, and more often several multiplexing elements. Each multiplexing stage introduces an undesirable delay in the path of the data.

In order to reduce such delays, it is known to use sense amplifiers, which convert a small signal into a greater logic level. Usually, a sense amplifier is provided for each level of multiplexing.

In order to understand the advantages of the invention described below, the operation of a state of the art DRAM design will first be described.

FIG. 1 shows a DRAM memory cell 1 according to the prior art. Each memory cell comprises of a capacitor 3, which is capable of holding a binary value in the form of charge stored on the capacitor, and a switch 5, for example a MOSFET. The switch 5 is interposed between a bitline 7 and the capacitor 3. The switch 5 is controlled by a wordline 9, which is normally but not exclusively orthogonal to the bitline 7. The wordline 9 and bitline 7 are used respectively to propagate the decoded address and the data through the array.

The capacitor 3 has a common node 11, which is typically connected to a voltage equal to half the supply voltage (i.e. Vcc/2). Thus, storage of logic 1 requires the capacitor to store a voltage level of Vcc, and for the storage of logic zero requires 0V or ground.

Due to losses caused by leakage, the state of the memory cell 1 must be refreshed at regular intervals.

The bitline 7 is typically precharged to a voltage equal to half the supply voltage (i.e. Vcc/2) and then left to float with this voltage stored on its parasitic capacitance, immediately before a memory cell is accessed for a read operation.

As is well known, during a read operation, the wordline 9 is enabled thereby turning the switch 3 ON such that the charge is shared between the capacitance of the bitline 7 and the storage capacitor 3 of the memory cell 1. This causes the voltage on the bitline 7 to rise above the common node voltage 11 for logic 1, or fall below the common node voltage 11 for logic zero. The sharing of the charge destroys the contents of the memory cell's capacitor 3. This phase of the read operation is called signal development.

The next phase of the read operation is the signal amplification and restore. Here, the differential signal is amplified using, for example, a cross-coupled inverter pair. This pulls the bitline to the full supply rail (either Vcc or 0V) which allows the memory cell to be restored, or refreshed.

The limit on the size of the array, as mentioned above, is resolved by the use of multiple arrays. The bitlines of each array are connected to a data bus using MOSFET switches which are controlled by an address decode similarly to that of the wordline, and this decode is commonly referred to as column decoding.

There may be several levels of column multiplexing dependent on the number of I/O's that are required. FIG. 2 shows a simplified three sense amplifier version of a current state of the art DRAM design.

The first stage of sense amplifiers 13 are used to sense the differential signal generated by a memory cell being read. The outputs of the sense amplifiers 13 are connected via MOSFET switches 15 to a data bus 17. The databus 17 connects the outputs from a number of first stage amplifiers 13 to a second stage sense amplifier 19.

Likewise, other second stage sense amplifiers, for example sense amplifier 21, receive outputs from similar arrays of first stage sense amplifiers. The outputs from the second stage sense amplifiers 19, 21 are connected to a third stage sense amplifier 25, via MOSFET switches 23 and a data bus 24. In the example shown, the third stage sense amplifier 25 provides a data I/O signal.

Traditionally, to save packaging costs the number of I/Os are limited relative to the size of the memory. Most state of the art 256 Mbit DRAMs have no more than 32 I/Os.

The disadvantage of these extra switches 15, 23 is that the combination of data bus parasitic capacitance and switch resistance introduces an electrical delay, thereby limiting the speed of the access. It is for this reason that the sense amplifiers 19, 25 are connected to the data buses 17 and 24 respectively, thereby speeding up the access.

However, the additional stages of sense amplifiers require complex control circuitry, thereby increasing the complexity of the DRAM. Indeed, although the example described above shows only three sense amplifier stages, it is not uncommon to use more than three stages to transfer data from the memory cell to the output.

FIG. 3 shows how a conventional DRAM design described above accesses a wordline's worth of data. As can be seen, column accessing is used to give the appearance of high bandwidth. Each column access requires approximately 60 ns to get data from the bitcell into the first stage sense amplifiers 13. To obtain a wordline's worth of data, (ie. the data from all the cells accessed by a particular wordline), "n" column access are required, (n being typically equal to eight).

The time taken to output a wordline's worth of data in this manner is not acceptable to many high speed data processing applications, for example graphic processing systems.

In addition, the additional switches, sense amplifiers, control circuitry and data buses, all add to the complexity of the integrated circuit design layout. Furthermore, the additional circuitry reduces the density of DRAM that is possible for a given area of integrated circuit, and reduces its manufacturing yield.

SUMMARY OF THE INVENTION

According to a first aspect of the invention, there is provided a dynamic random access memory device comprising a plurality of bitlines, a plurality of wordlines arranged to cross the plurality of bitlines so as to form an array, a plurality of memory cells associated with the wordlines and bitlines, and a plurality of sense amplifiers, each sense amplifier having first and second inputs operatively connected to a bitline and a reference voltage respectively, characterised in that the number of sense amplifiers is equal to the number of data I/O lines of the memory device.

According to the present invention, there is provided a dynamic random access memory device comprising an array of memory cells each of which has an output line associated therewith, the memory cells being arranged in an array having a width equalling the number of data bits transferred in parallel to and from the device.

According to another aspect of the present invention, there is provided a data processing architecture comprising a plurality of processor devices, each processor having an associated portion of DRAM, each portion of DRAM having an array of bitlines and wordlines, and an associated row of first stage sense amplifiers, characterised in that the number of first stage sense amplifiers equals the number of bits in the associated processing device.

According to another aspect of the present invention, there is provided a method of fabricating a dynamic access random memory, the method comprising the steps of:

arranging a plurality of bitlines orthogonal to a plurality of wordlines;

pairing adjacent bitlines to form a column;

connecting each column to a first stage sense amplifier; characterised in that, the step of arranging the bitlines involves selecting the number of bitlines such that the total number of columns equals the bit width of an associated interface device.

BRIEF DESCRIPTION OF THE DRAWINGS

For a better understanding of the present invention, and to show more clearly how it may be carried into effect, reference will now be made, by way of example, to the accompanying drawings, in which.

DETAILED DESCRIPTION OF A PREFERRED EMBODIMENT OF THE INVENTION

According to the present invention, the bandwidth of the DRAM memory is directly matched to its associated I/O or processing device. This means that the DRAM does not require complex multiplexing, and only requires first stage sense amplifiers. Therefore, second, third, (and any additional) stages of sense amplifiers are not required.

Figure 1:
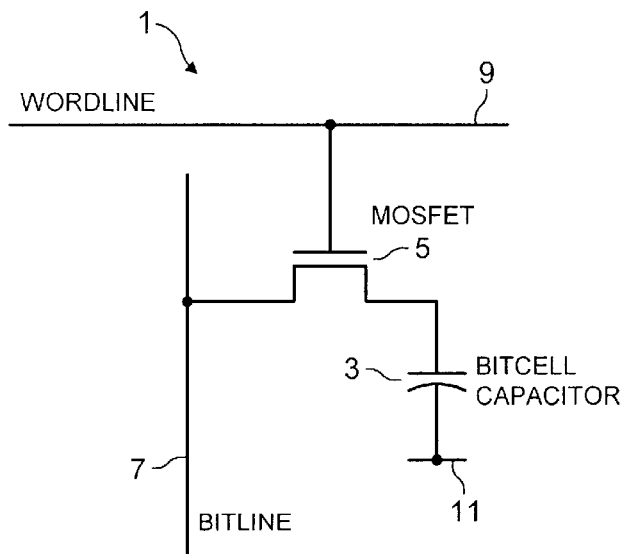
FIG. 1 shows a DAM cell according to the prior art.
Figure 3:
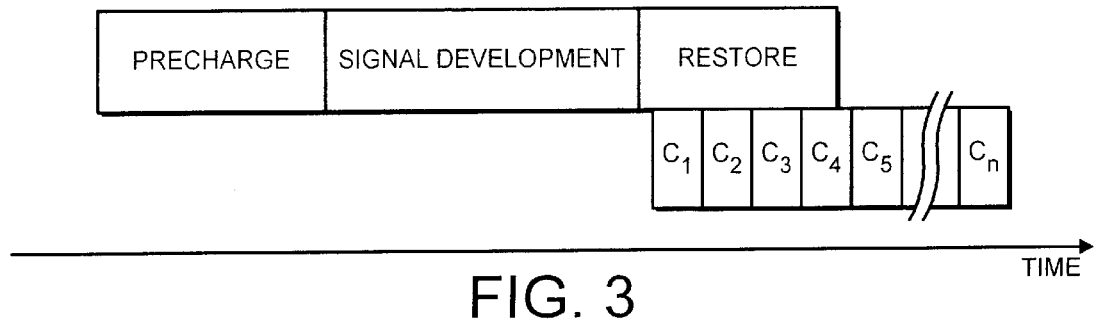
FIG. 3 shows a typical data access cycle for accessing a wordline's worth of data in a conventional DRAM.
Figure 2:
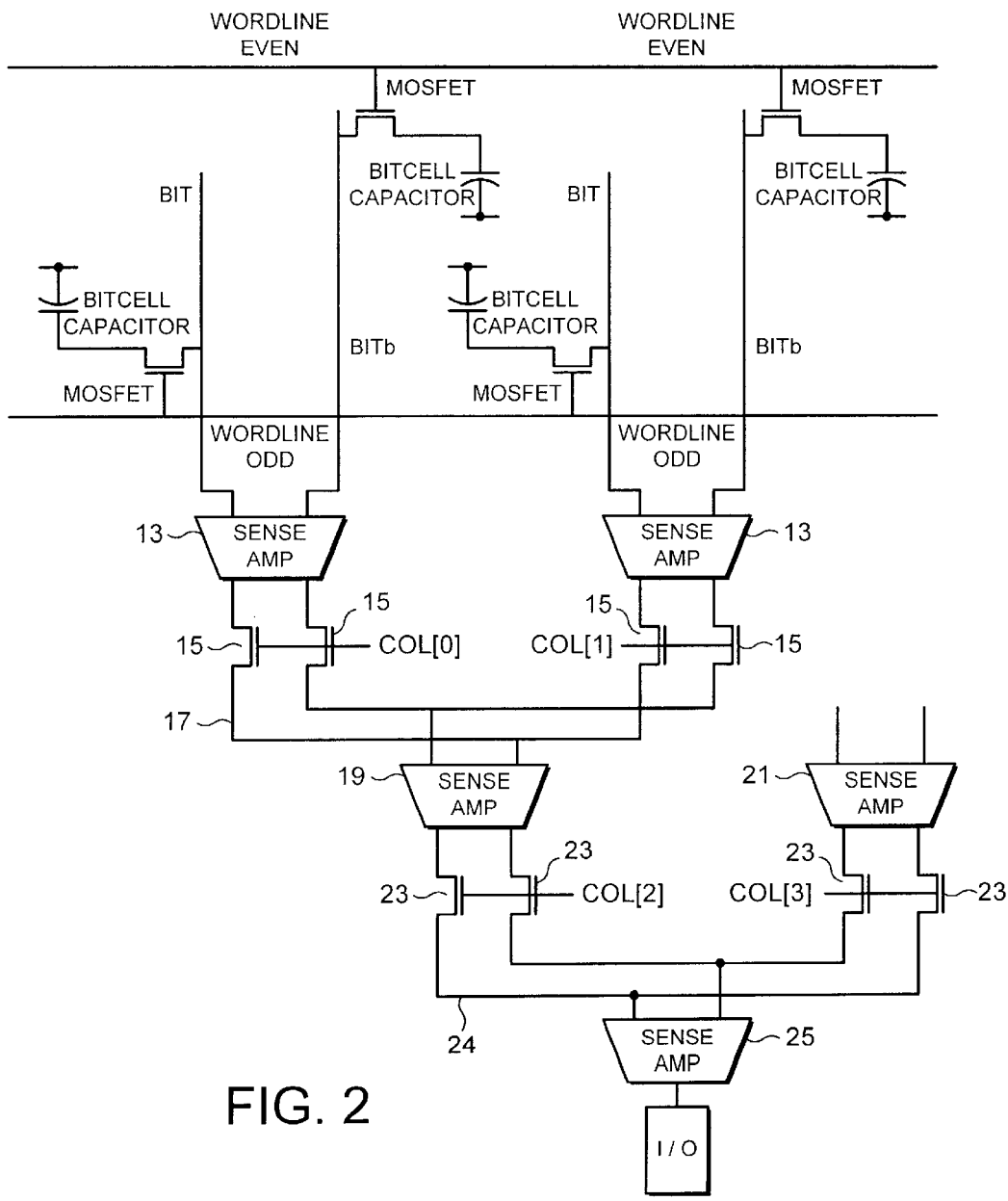
FIG. 2 shows a conventional DRAM having three stages of sense amplifiers.
Figure 4:
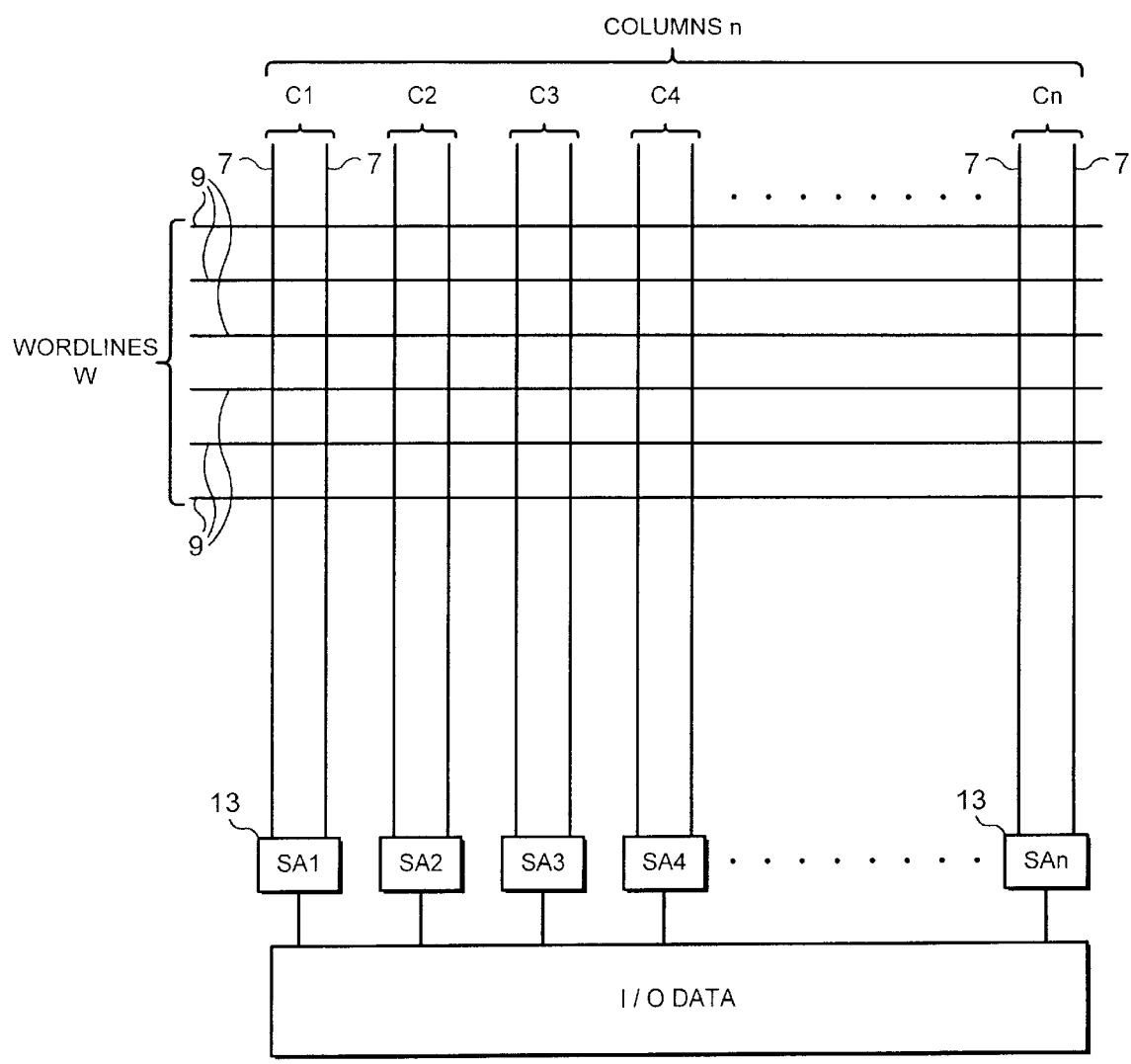
FIG. 4 shows a DRAM according to a preferred embodiment of the present invention.

Referring to FIG. 4, according to the present invention, a DRAM is arranged such that the total number of columns Cn, or its width, corresponds to the size of the I/O or processing device that the DRAM is associated with in use. For example, if the DRAM interfaces with a 64-bit processing unit, the DRAM will be configured so that the number of columns Cn equals 64 (i.e. the width of the array is 64 columns). The example shown uses a folded pair, whereby each column comprises a pair of bitlines 7.

The number (W) of wordlines 9 is determined by the required size of the memory; the width of the array remains constant and determined by the input/output requirements. Thus, for a relatively small memory such a 2K bits, the DRAM array will be "short" and "wide".

This is in contrast to conventional memory arrays which are square, (ie. equal numbers of rows and columns), in order to minimise the length of bitlines and wordlines due to the problems associated with parasitic capacitance, as mentioned earlier.

Furthermore, since the I/O or processing device is directly matched to the number of columns in the DRAM, there is no requirement for a data bus in the memory device. The integrated circuit layout and circuit design is thus simplified since a data bus need not be routed through an array of wordlines and bitlines, and the associated control logic is also dispensed with. This in turn requires less silicon area, which means that the density of memory elements in the DRAM can be increased, with a consequent reduction in manufacturing costs.

Figure 5:
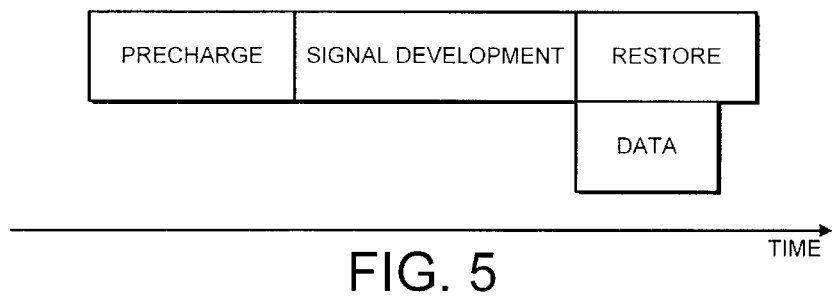
FIG. 5 shows a data access cycle for accessing a wordline's worth of data according to the invention; and, FIG. 6 shows a typical application of the DRAM according to the preferred embodiment of the present invention.

FIG. 5 shows a typical operation for accessing a wordline's worth of data in a DRAM according to the present invention. As can be seen, the data is made available in just one column access, thereby greatly reducing the time taken to access a wordline's worth of data.

Other advantages of the invention include a reduction in power consumption (due to reduced numbers of sense amplifiers and no databus) and a reduction in control logic and complex timing signals (due to the removal of multiplexing).

The present invention is particularly suited to applications such as parallel processing, in which a number of separate processing units require fast access to a relatively small amount of DRAM memory.

Figure 6:
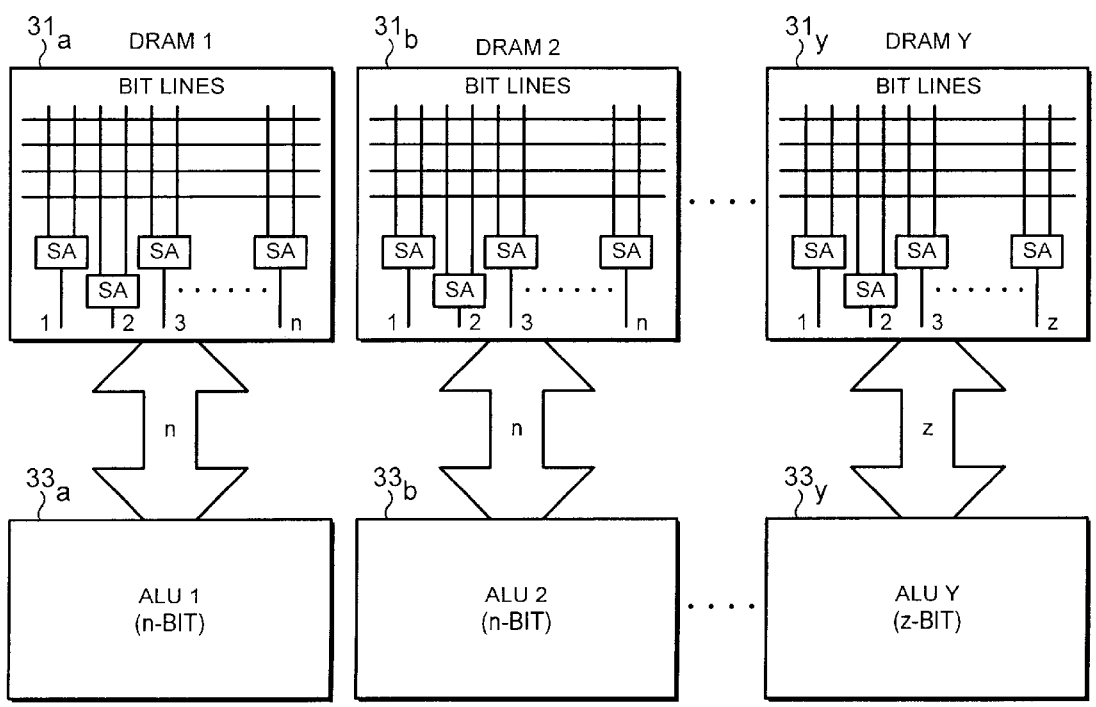

FIG. 6 shows such an arrangement in which a number of distributed portions of DRAM 31a, 31b . . . 31y, are directly accessed by separate processing units 33a, 33b . . . 33y (ALU1, ALU2 . . . ). Each portion of DRAM is arranged such that the number of columns (the width) equals the number of bits used by the associated processing unit. For example, DRAM 31a has n columns, which matches the n-bit ALU 1, 33a. In a similar way, DRAM 31y has z columns, which equals the z-bit ALU Y, 33y.

The processing units mentioned above may be physically separate devices, or may be separate processors provided on a common integrated circuit or ASIC. Likewise, the associated DRAM may be physically separate from the processors, or on a common integrated circuit or ASIC.

The invention is particularly suited to applications in which the DRAM is embedded, ie. on the same integrated circuit as the processing unit(s) or logic that uses it.

It is noted that the width of the DRAM may be made any size so that it matches the required bandwidth of its associated processing device(s). In particular, when the DRAM is embedded as described above, there is no limit to the column width, since there is no physical limit imposed by the number of I/O pins available on the IC package, (ie. the outputs of the DRAM may be connected directly to their destinations within the embedded application).

Although the description above has been explained with reference to memory read operations, it will be appreciated that the invention is equally applicable to memory write operations.

In addition, although the preferred embodiment relates to columns defined as folded pairs of bitlines, the invention also applies to other arrangements known in the art. For example, each sense amplifier may be connected to receive a single bitline, with its other input being connected to a reference voltage.

Furthermore, although the bitlines have been shown to be vertical and the wordlines horizontal, the invention equally applies vice versa, ie. the memory having the bitlines arranged horizontally and the wordlines vertically. Likewise, although the presence of a charge has been used to indicate a logic "1" and the absence of charge to indicate a logic "0", the invention is also applicable where a logic "1" is represented by the absence of a charge and logic "0" represented by the presence of a charge.

What is claimed is:

1. A dynamic random access memory device comprising a plurality of bitlines, a plurality of wordlines arranged to cross the plurality of bitlines so as to form an array, a plurality of memory cells associated with the wordlines and bitlines, and a plurality of sense amplifiers, each sense amplifier having first and second inputs operatively connected to a bitline and a reference voltage respectively, characterised in that the number of sense amplifiers is equal to the number of data I/O lines of the memory device.

2. A memory device as claimed in claim 1, wherein each bitline has an associated bitline, the associated bitline acting as the reference voltage.

3. A memory device as claimed in claim 1, wherein each bitline comprises first and second bitline portions, and wherein, for each bitline of the device, the first bitline portion provides the reference voltage for the second bitline portion and the second bitline portion provides the reference voltage for the first bitline portion.

4. A memory device as claimed in claim 3, wherein the memory cells are located at the crossing points of a first group of wordlines and the first bitline portions, and at the crossing points of a second group of wordlines and the second bitline portions, such that, for each wordline of the device, only one bitline portion per bitline is connected with a memory cell.

5. A memory device as claimed in claim 1, wherein the memory device is an embedded DRAM device.

6. A memory device as claimed in claim 5, wherein the device is provided on a semiconductor substrate which also carries a processing device which is operable to transfer data bits with the memory device.

7. A data processing device comprising a processing device for processing data bits, and a memory device as claimed in claim 1, wherein the processing device and memory device are provided on the same semiconductor substrate, and data bits are transferred directly between the processing device and the memory device.

* * * * *